United States Patent [19]

Greer

[11] Patent Number: 4,933,588

[45] Date of Patent: Jun. 12, 1990

[54] HIGHER ORDER TRANSVERSE MODE SUPPRESSION IN SURFACE ACOUSTIC WAVE RESONATORS

[75] Inventor: James A. Greer, Andover, Mass.

[73] Assignee: Raytheon Company, Lexington, Mass.

[21] Appl. No.: 289,132

[22] Filed: Dec. 23, 1988

[51] Int. Cl.$^5$ ............................................. H01L 41/08
[52] U.S. Cl. .............................. 310/313 D; 310/312; 310/313 R; 333/151; 333/155; 333/194; 29/25.35
[58] Field of Search ............... 310/312, 313 R, 313 B, 310/313 D; 333/151, 153, 194, 195; 29/25.35

[56] References Cited

U.S. PATENT DOCUMENTS

| | | | |
|---|---|---|---|
| 3,581,248 | 5/1971 | De Vries | 333/194 |
| 3,818,379 | 6/1974 | Wauk, III | 310/313 D X |
| 3,908,137 | 9/1975 | Hunsinger et al. | 310/313 D |
| 4,204,178 | 5/1980 | Mitchell | 310/313 D X |
| 4,243,960 | 1/1981 | White et al. | 310/313 R X |
| 4,434,383 | 2/1984 | Cho et al. | 310/313 D X |
| 4,757,283 | 7/1988 | Greer | 333/195 |

Primary Examiner—Mark O. Budd
Attorney, Agent, or Firm—Denis G. Maloney; Richard M. Sharkansky

[57] ABSTRACT

A technique for adjusting the frequency of odd mode transverse waves propagating in a SAW device is described. A pair of localized regions of frequency determining trimming material are deposited onto selected portions of a surface wave propagating surface, to provide localized regions on said surface where the odd order transverse mode has energy maxima. These regions change the acoustic properties and hence the velocity characteristics of the surface wave propagating surface in said regions. The frequency of the odd mode transverse wave is changed accordingly and is preferably changed to match that of the fundamental transverse propagating wave. This decreases the insertion loss of the device at the fundamental frequency and eliminates the odd mode transverse wave propagation characteristic within the operating frequency range of the resonator. In a preferred embodiment, the SAW device further includes an acoustically matched piezoelectric transparent cover disposed over the surface wave propagating surface having disposed thereon a trim pad which is selectively removed to provide the localized regions and thus the localized alterations in the acoustic properties of the surface acoustic wave device.

13 Claims, 6 Drawing Sheets

HIGHER ORDER TRANSVERSE MODE SUPPRESSION IN SURFACE ACOUSTIC WAVE RESONATORS

BACKGROUND OF THE INVENTION

This invention relates generally to surface acoustic wave devices and more particularly to narrowband surface acoustic wave resonators.

As is known in the art, SAW surface acoustic wave resonators are used in high precision and highly stable, low noise oscillators. The SAW device is used as a frequency stabilizing element in the feedback loop of both electronically controlled oscillators and free running oscillators. Such oscillators are used in radar systems, electronic counter measure systems, as well as, other communication and electrical systems.

In a radar system a low noise, highly stable oscillator is often used to synchronize all the radar signals in phase and frequency. One requirement for advanced radar systems is to increase the capability of the radar to detect small objects at further distances. It can be shown that the detection capability of a radar is related to the system noise which is related to the output power and noise characteristics of the oscillator. If more output power can be extracted from an oscillator without increasing the noise level of the oscillator, then the noise floor of the radar system will be reduced. Reduced system noise will increase the signal to noise ratio of the radar and concomitant therewith the detection capabilities of the radar. Thus, it is desireable to provide higher output powers at low noise levels from SAW-stabilized oscillators to reduce the system floor noise of the radar and increase its detection capabilities.

Generally, in there applications, SAW resonators are used in the feedback loop of the oscillator to stabilize the frequency of oscillations of the feedback loop. A SAW resonator generally includes a surface which supports surface acoustic wave propagation having disposed thereon a pair of spaced interdigitated transducers which are coupled to the surface wave propagating surface. Each interdigitated transducer includes a pair of terminals having a plurality of conductive members, with the conductive members associated with one terminal being interdigitated with the conductive members associated with the other one of the terminals. A pair of reflecting gratings are disposed to confine surface wave propagation as also known.

To provide a SAW resonator which can operate at a relatively high power, it is generally necessary to increase the acoustic aperature of the SAW resonator. The acoustic aperture is increased by increasing the length of the conductive stripes. Increasing the length of the conductive stripes, however, has the effect of increasing the resistance of the stripes which increases the insertion loss of the transducers. Increased insertion loss is generally undesirable. Therefore, in order return the insertion loss of the SAW resonator to that provided previously, it is often necessary to increase the number of conductive members. This results in more conductive members being connected in parallel to provide an effective overall reduction in the resistance of the members and thus returning the transducer to comparable low insertion loss.

Commonly, it is also desired to provide a SAW resonator having a relatively low insertion loss. This is accomplished as indicated above by increasing the number of conductive strips in the transducer. Reducing insertion loss has the effect of lowering the Q of the resonator and likewise degrades noise characteristics of the resonator.

It has been known for some time that high order transverse modes propagate in SAW resonator, as described in a paper by H. Haus entitled "Modes in SAW Grating Resonators", Journal of Applied Physics, Vol. 48, No. 12, December 1977, pg. 49, 55. The above paper indicates that Rayleigh wave type propagation of higher order transverse modes occurs in SAW grated resonators.

Higher order transverse mode propagation includes even order transverse modes and odd order transverse modes. The even order transverse modes are generally not a problem, since the phase of even transverse modes is symmetrically distributed occurs across the acoustic aperture of the device. The phase of odd order transverse modes, however, is a problem since the phase is symmetrically distributed. The acoustic energy stored in the resonant cavity at higher order odd transverse mode has a different spacial distribution than the frequency of the fundamental mode. Further, the resonant frequencies of the higher order transverse modes are higher than the frequency of the fundamental resonant mode.

Such higher order modes have not generally been a problem in SAW resonators when used in standard, low power oscillator applications. This is because in the standard resonator device, the third order transverse mode typically has a magnitude of between about 2-10 dB below the minimum insertion loss of the fundamental mode, and at a frequency of about 50 to 100 ppm higher than the frequency of the fundamental mode. With high power and/or low insertion loss resonators, it has been found that the wider aperatures and extra fingers change the frequency and insertion loss characteristics of the third order transverse mode.

With high power resonators for example, the insertion loss of the third order mode may appear only 1 dB below the insertion loss of the fundamental mode, at a frequency of about 35 ppm above the frequency of the fundamental. The fundamental mode frequency is generally determined by its 1 dB bandwith, that is the frequency range over which the insertion is within 1 dB of the minimum insertion loss of the fundamental mode. Thus, it becomes apparent that with higher power/lower insertion loss resonators, the third order transverse mode may be encompassed within the 1 dB bandwith of the resonator and will significantly decrease the Q of the resonator. This arrangement will degrade the phase noise performance of an oscillator using such a SAW resonator.

Accordingly, the requirement for new high power/low insertion loss resonators have presented a need to address the third order transverse mode and higher odd-order modes in the SAW resonator.

SUMMARY OF THE INVENTION

In accordance with the present invention, a surface acoustic wave device includes a base having a surface for supporting surface wave propagation, including a pair of transducers coupled to said surface wave propagation surface, and means, disposed over regions of said surface wave propagation surface where an odd order transverse mode has energy maxima, for locally changing the surface wave velocity characteristic in said regions, by adjusting the frequency of the odd order transverse mode to be substantially equal to that of the fundamental transverse mode. With this particular arrangement, the frequency of the odd order transverse mode is adjusted to be substantially equal to the frequency of the fundamental mode. This eliminates degradation in phase noise due to presence of these higher order transverse mode in the SAW resonator.

In accordance with a further aspect of the present invention, a surface acoustic wave resonator includes a base having a surface which supports surface acoustic wave propagation including a pair of transducers coupled to said surface acoustic wave propagation surface, said transducers including interdigitated conductive stripes disposed across first selected portions of said surface. A cover is disposed over said base to enclose said base. Said cover comprises a material which is optically transparent to electromagnetic energy generally in the wavelength range of about 0.185–4.0 μm. A layer of material is disposed on an inner portion of the cover over said surface wave propagation surface in a region thereof disposed between said pair of transducers. First and second selected portions of said layer are disposed on said surface wave propagation surface in regions of said surface where an undesired odd order transverse mode has energy maxima to change the frequency of said odd order transverse mode to be substantially equal to that of the fundamental transverse mode. With this particular arrangement, the SAW resonator will have improved bandpass characteristics, and reduced insertion loss at the fundamental frequency and be more useful for voltage control oscillator and free-running oscillator applications. Further, the insertion loss at the fundamental is reduced and the Q is increased because the frequency of third order transverse mode is shifted to be substantially equal to that of the fundamental mode, increasing energy of the device at the frequency of the fundamental mode.

In accordance with a further aspect of the present invention, a method of improving the bandpass characteristic of a SAW resonator comprises the step of depositing a pair of layers of material over a pair of selected portions of the surface wave propagation surface to change the frequency of a selected higher order transverse mode of said resonator. With this particular arrangement, a technique is provided to improve the bandpass characteristics of the SAW resonator. Concomitantly therewith, insertion loss at the fundamental mode propagation for the SAW resonator is also improved, since the frequency of the higher order mode is selected to substantially match that of the fundamental mode and, therefore, the energy at the higher order mode is added to the energy at the fundamental mode resulting in the lower insertion loss at the frequency of the fundamental mode.

In accordance with a further aspect of the present invention, a surface acoustic wave resonator includes a base having a surface which supports surface acoustic wave propagation including a pair of transducers coupled to said surface acoustic wave propagation surface, with said transducers including interdigitated conductive stripes disposed across first selected portions of said surface. A cover is disposed over said base to enclose said base. Said cover comprises a material which is optically transparent to electromagnetic energy generally in the wavelength range of about 0.185–4.0 μm. A layer of material is disposed on an inner portion of the cover over said surface wave propagation surface in a region thereof disposed between said pair of transducers. First and second selected portions of said layer are disposed on said surface wave propagation surface partially across said aperture, where an undesired odd order transverse mode has energy maxima to change the frequency of said odd order transverse mode to be substantially equal to that of the fundamental mode transverse wave. A third portion of said layer of material is disposed on said surface acoustic wave propagation surface across the acoustic aperture of said SAW device to change both the fundamental frequency of the device and the suppressed higher order transverse mode frequency of the device to tune the SAW resonator to a desired frequency characteristic. With this particular arrangement, higher odd order transverse modes are suppressed, and the fundamental mode frequency is adjusted to provide a device having improved insertion loss and passband characteristic with selected or adjusted fundamental frequency characteristics.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
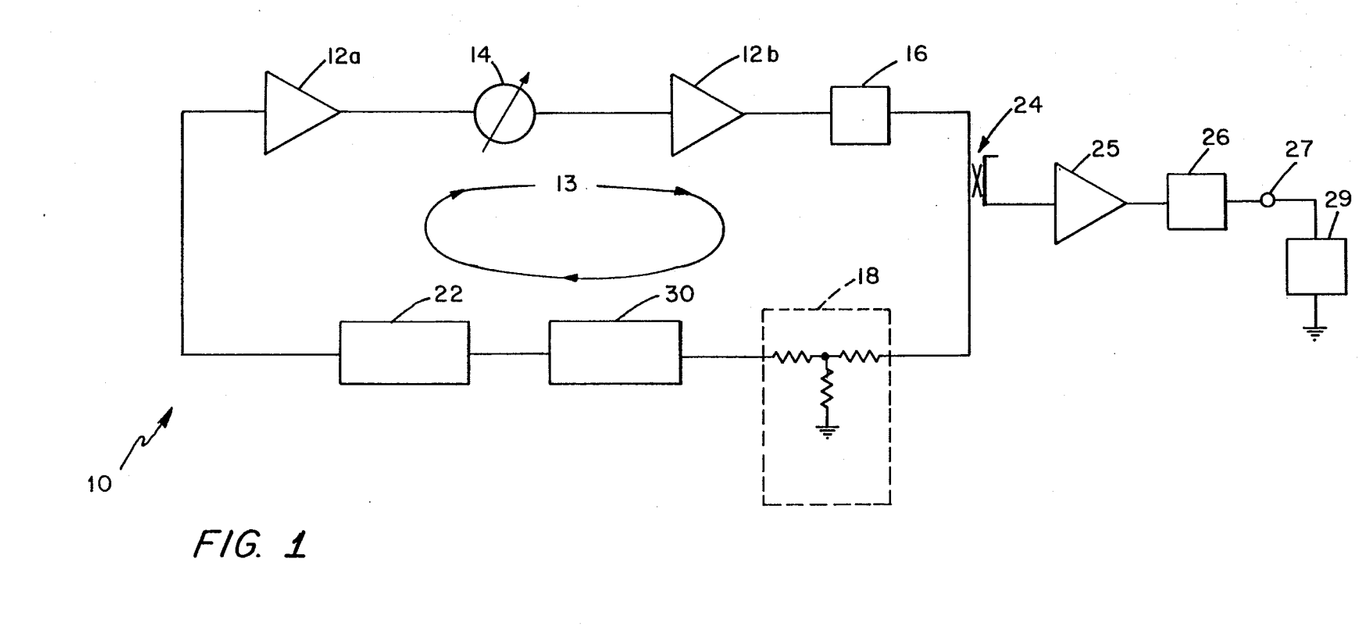
FIG. 1 is a block diagram of a voltage controlled oscillator utilizing a SAW resonator as a frequency stabilizing element.

Referring now to FIG. 1, a voltage controlled, SAW resonator stabilized, low floor noise oscillator 10 is shown to include low noise components such as a feedback loop 13 comprising loop amplifiers 12a and 12b, a voltage controlled oscillator 14, a voltage limiter 16, a loop signal sampling coupler 24, an attenuator 18, a SAW resonator 30, and a coarse loop phase adjustment means 22 as shown. The SAW resonator 30 is used in the feedback loop 13 around amplifiers 12a and 12b to provide the requisite phase shift characteristics of the signal propagating in the feedback loop and to stabilize the frequency of the signal generated by said loop. The electronic phase shifter 18 is used to electrically fine tune the frequency of the oscillator 10 over a predetermined bandwidth. The limiter 16, attenuator 18, and the loop phase adjustment 22 are also provided to make adjustments in the loop characteristics of the oscillator 10. As is known, sustained oscillations will be provided at a frequency where the amplifiers provide sufficient gain to compensate for losses in the feedback loop, and where the loop has a phase characteristics equal to a multiple of $2\pi$ radians. The electronic phase shifter 14 provides a relatively small variable phase shift to the characteristics and thus electronically changes the frequency of the oscillator 10.

In many applications, it would be desirable to increase the power in the loop 13 by providing higher power amplifiers. This will reduce the floor noise of the oscillator. However, to increase the loop power, the power handling capabilities of the SAW resonator must also be increased. The output signal at the output of coupler 24 is fed to a buffer amplifier 25 which is used to prevent loading of the oscillator from the remainder of the circuit. Optionally, this signal may be fed through a low pass filter 26 to improve the purity of the signal before being coupled to the output terminal 27 of the oscillator 10. The output signal is fed to a load 29 which here may be a radar system.

A preferred embodiment for the SAW resonator 30 useful for a low noise floor oscillator circuit 10 as shown in FIG. 1 will now be described in conjunction with FIGS. 2–4.

Figure 2:
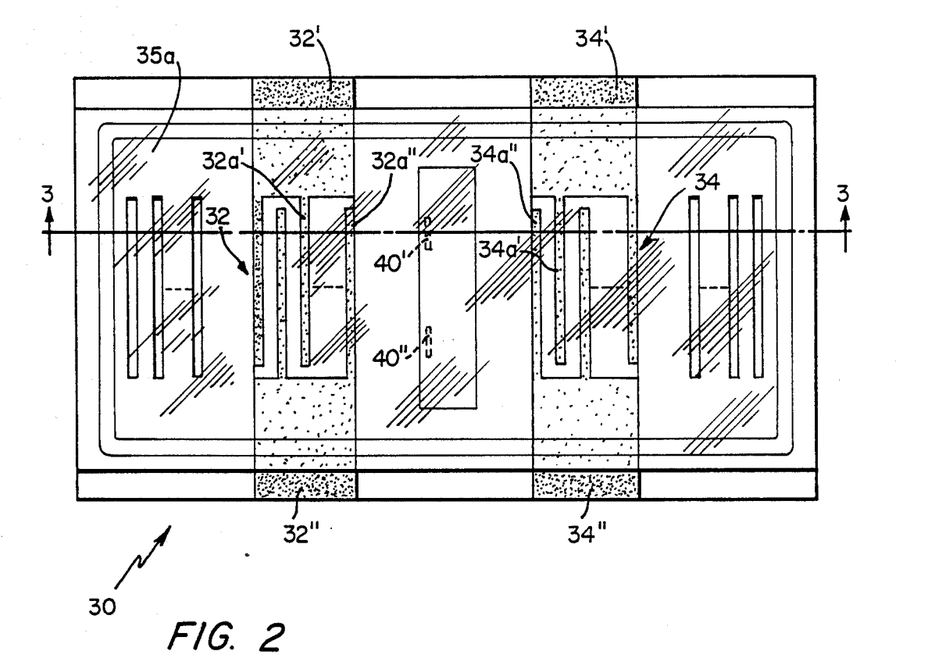
FIG. 2 is a plan view of a SAW resonator which may be used in the SAW stabilized oscillator of FIG. 1 fabricated in accordance with the present invention.
Figure 3:
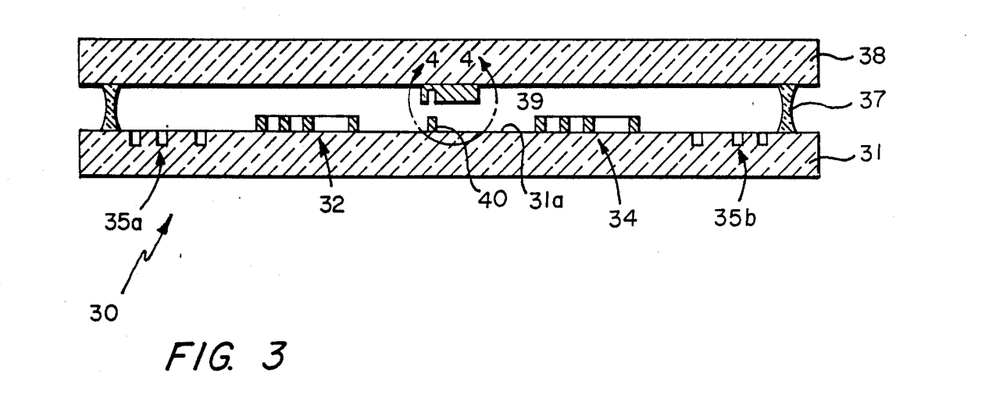
FIG. 3 is a cross-sectional view taken along lines 3—3 of FIG. 2.

Referring now to FIG. 2, the SAW resonator 30 is here shown to include a base 31 having a surface 31a which supports surface wave propagation. Here said base 31 is comprised of an ST-cut or a rotated ST-cut of quartz although other materials (such as lithium niobate) may alternatively be used. Disposed on quartz base 31 are here a pair of transducers 32, 34 with here transducer 32 being an input transducer, and transducer 34 being an output transducer. Each one of said transducers include a pair of terminals 32′, 32′′′ and 34′, 34′′ and a plurality of conductive stripes or strip conductors 32a, 32a′ and 34a, 34a, as shown. Thus considering transducer 32 as an exemplary of one of said transducers, transducer 32 includes a pair of conductive terminals 32′, 32′′ with each one of said conductor terminals connecting a plurality of conductive stripes 32a, 32a′, said stripes being interdigitated. Here said stripes are comprised of aluminum and are recessed into grooves provided in the SAW surface 31a. That is, the stripes from terminal 32′ are disposed across the surface 31a and alternately spaced between corresponding stripes from terminal 32′′. Resonator 30 further includes a pair of reflecting gratings, here 35a, 35b which are here comprised of a plurality of slots or grooves disposed in the surface 31a. Here said grooves, as well as, the conductive members are about equal to one quarter of a wavelength in width and are also spaced approximately one quarter of a wavelength apart, as is commonly known. The combination of the reflecting gratings 35a, 35b and the transducers, provide a resonant structure having a very high Q and very sharp frequency passband characteristics. Preferably, the resonator 13 is sealed in an all-quartz package and includes a sealing member 37 here comprised of a glass frit and a cover member 38 here comprised of a material crystallographically matched to the material of the base 31. Disposed on an inner portion of cover 38 is a pad 39 here comprised of a tri-level film as will be described.

Still referring to FIG. 2, pads 40′ and 40′′ are shown disposed on surface 31a. Pads 40′ and 40′′ are used to provide small localized changes in the surface wave velocity characteristic across a relatively small portion of the acoustic aperture of the device 10 to permit tuning of the third order transverse mode frequency without significantly changing the frequency of the fundamental transverse mode. Here tuning is accomplished by reducing the frequency of the third order transverse mode such that it is substantially equal to the frequency of the fundamental transverse mode.

Figure 4:
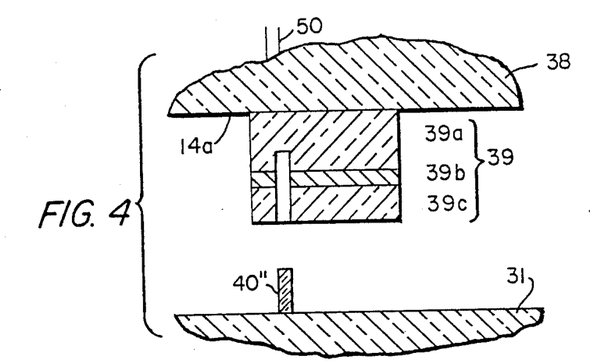
FIG. 4 is an exploded, enlarged view of a portion of FIG. 3 taken along ling 4—4 of FIG. 3.

Referring now to FIG. 4, a preferred arrangement for providing regions 40′ and 40′′ to change the frequency of the third order transverse mode and thus suppress the third order transverse mode is shown. Pad 39 which is disposed over an inner portion of cover 38 is here a tri-level composite pad and includes a thermally insulating buffer layer 39a, a thermal radiating layer 39b, and a thermally ablatable layer 39c, with here layers 39a and 39c being comprised of aluminum oxide and layer 39b being comprised of aluminum. Incident laser energy 50 is directed through the cover 38 and layer 39a to layer 39b to provide a localized heated region thereof, which is used to ablate off a portion of the composite layer 39 to provide deposits 40′ or 40′′ as shown.

Figure 5:
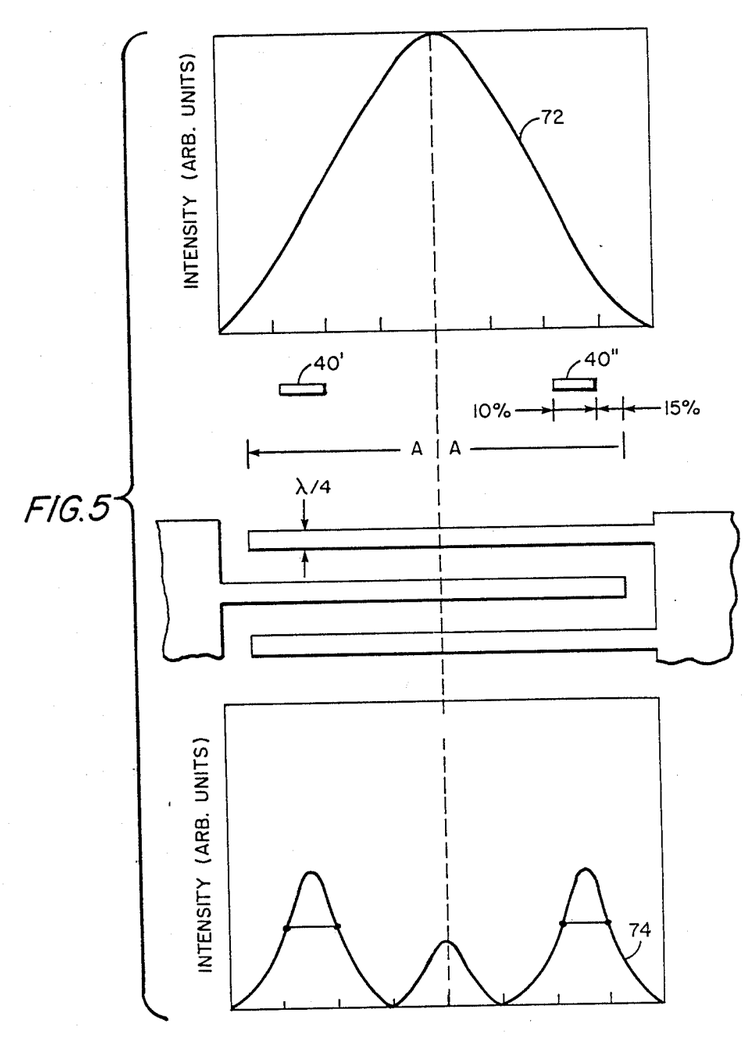
FIG. 5 is a diagrammatical view showing typical relationships of the distributions of energy for the fundamental transverse mode, and the third order transverse mode across the acoustic aperture of a typical SAW resonator.

FIG. 5 shows the energy distribution across the acoustic aperture of the fundamental transverse mode propagation 72 and for the third order transverse mode 74. By depositing small regions of material across relatively small portions of the acoustic aperture in regions thereof where the third order transverse mode is maximal energy, the frequency of the third order transverse mode is shifted to be substantially equal to that of the fundamental mode.

The active length of the interdigitated conductive members 32, that is the area over which the conductive members transversally overlap is defined as the active or acoustic aperture of the device and is denoted in FIG. 5 by the reference AA.

The surface acoustic wave device operates by feeding an input signal to the input transducer 32, which provides an electrical potential across the electrode terminals 32′, 32′′. This causes crystal structure deformation in the surface acoustic wave surface 31a. This deformation propagates as a transverse wave along the surface wave device 30 to the output terminal 34. The wave is confined by the reflecting gratings 35a, 35b and is coupled to the output pair of electrodes 34′, 34′′ of transducer 34. The alternating compression and rarification of the crystal structure of the surface acoustic wave through the piezoelectric interaction produces corresponding voltage fluctuations across the electrodes 34′, 34′′, thereby providing a replica of the signal coupled to the transducer 32.

It has been shown as mentioned in the above article that other modes besides the fundamental transverse mode propagate in such devices. Even modes which propagate in such devices have no net effect on the output produced at output transducer 34, since the even modes have a asymmetric phase distributions across the acoustic aperture of the SAW device. The odd modes, however, have a symmetric phase distribution across the acoustic aperture of the device, and the energy from propagation of odd modes appears as perturbations in the insertion loss characteristic of the SAW resonator.

Figure 9:
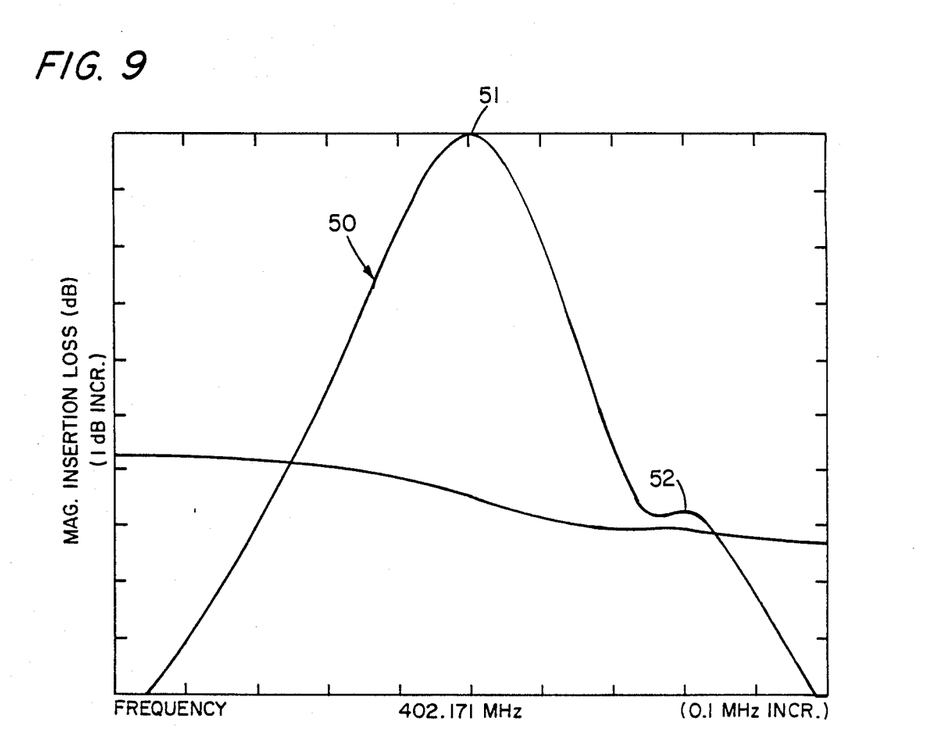
FIG. 9 is a plot of magnitude vs. frequency for the magnitude and phase of the fundamental mode of a standard SAW resonator having a third order transverse mode.
Figure 10A:
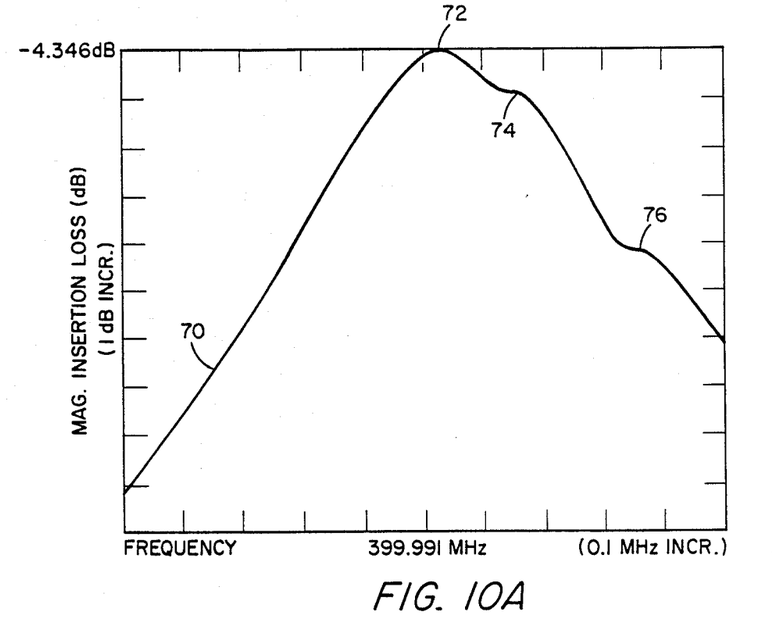
FIG. 10A is a plot of magnitude vs. frequency for the magnitude of the fundamental mode of a higher power SAW resonator having a third order transverse mode about within the 1 db bandwidth of the fundamental mode.
Figure 10B:
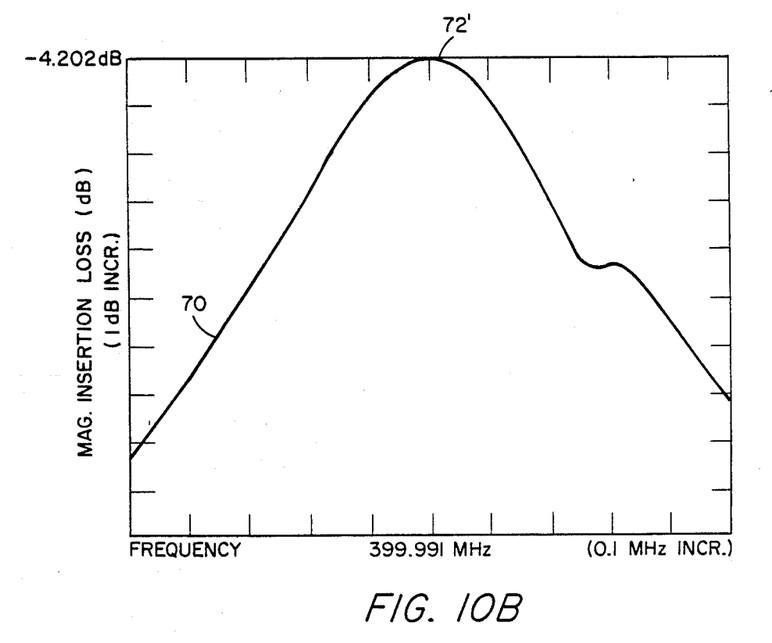
FIG. 10B is a plot of the device of FIG. 10A having the third order transverse mode adjusted in accordance with an aspect of the present invention.

As an illustrative example, the frequency characteristics of standard type of SAW resonator (FIG. 9) and a high power SAW resonator are shown in FIGS. 10A and 10B.

FIG. 9 shows the insertion loss characteristic for a standard SAW resonator. The insertion loss as a function of frequency for the fundamental mode is shown as curve 50. The third order transverse mode occurs as the perturbation 52 in curve 50. The insertion loss of this perturbation is approximately 7 dB higher than that at the fundamental 51. The frequency of this perturbation is approximated 100 ppm higher than the frequency of the fundamental mode. This characteristic was provided from a standard SAW resonator having a center frequency of 402.171 MHz and having transducers with 51 fingers each, and with each finger 150 acoustic wavelengths long.

FIG. 10A shows the insertion loss characteristic as a function of frequency for a higher power-lower loss SAW resonator having transducers with 61 fingers and an acoustic aperture or finger length equal to 200 acoustic wavelengths. The insertion loss characteristic 60 has a minimum loss at 61 which corresponds to the center frequency of the SAW resonator. The third order transverse mode provides a perturbation at 62 which has an insertion loss only 1 dB higher than the minimum insertion loss of the fundamental transverse mode 61. Moreover, the frequency is shifted closer to the frequency at the fundamental, that is being within approximately 35 ppm of the frequency of the fundamental. Since the frequency characteristic of a SAW resonator 31 is determined by the 1 dB bandwidth of the SAW resonator at the fundamental frequency 61, the third order transverse mode is now shifted substantially close to or within the 1 dB bandwidth at the fundamental mode. This resonator when used in an oscillator application may provide deliterious effects on oscillator performance.

By knowledge of the higher order transverse mode distribution, that the maximal energy of the third order mode is confined to the regions near the peripherial portions of the acoustic aperture and generally away from central portions of the acoustic surface, selective deposits may be provided in those regions while monitoring the insertion loss characteristic to thus tune these SAW devices to provide the insertion loss characteristic as shown in FIG. 10B. In FIG. 10B the energy of the third order transverse mode has been added to the energy of the fundamental mode, thus providing the device with lower insertion loss at the frequency of the fundamental mode without the perturbation 72 (FIG. 10A, third order transverse mode in the insertion loss characteristic 70. The frequency of the third order transverse mode has been shifted slightly lower in frequency such that it is substantially equal to the frequency of the fundamental mode. This also is shown by the slight reduction in the insertion loss at the frequency of the fundamental mode ($-4.346$ dB to $-4.202$ dB) after the application of deposits of material 40' and 40''.

In the example shown in FIG. 5, the pads 40' and 40'' each having a length across the aperture of about 15% of the acoustic aperture and are located starting at a distance of about 10% away from the edges of the acoustic aperture.

A preferred technique for suppressing the third order transverse mode wave propagation is to insert the completed SAW device in a network analyzer and monitor the insertion loss characteristic about the center frequency range of the SAW device. During such monitoring, a characteristic as shown in FIG. 10A will appear, having a minimum insertion loss characteristic denoted at 72 of curve 70 which corresponds to the insertion loss characteristic for the fundamental transverse mode. A first perturbation 74 at a slightly higher frequency which corresponds to the third order transverse mode, and a subsequent perturbation 76 corresponding to the fifth order mode as also shown. The material deposits 40' and 40'' are provided by application of an excimer laser beam through the cover to ablate off selected portions of pad 39 onto the surface wave propagation surface. If material is deposited in the correct locations (i.e. away from the center), the perturbation 74 will move closer to the minimum insertion loss at 72 until the energy of the third order mode is added to that of the fundlemental. If it were desired to surpress the fifth order transversal, more generally four deposits (not shown) would be used, again the deposits would be disposed away from the center of the acoustic aperture.

Figure 6:
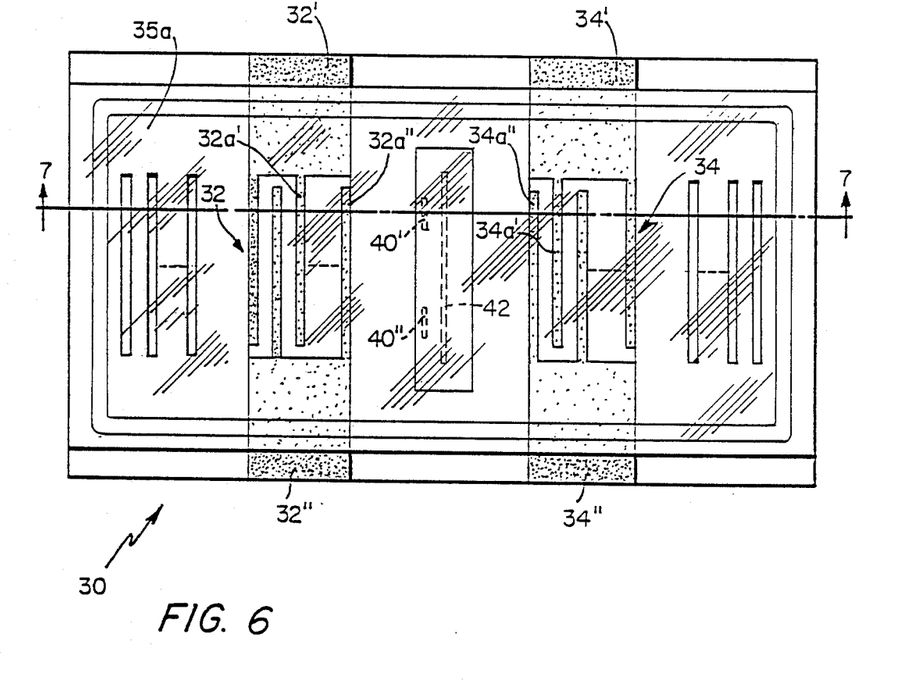
FIG. 6 is the SAW resonator of FIG. 2 having a layer disposed to change the fundamental frequency of the resonator.
Figure 7:
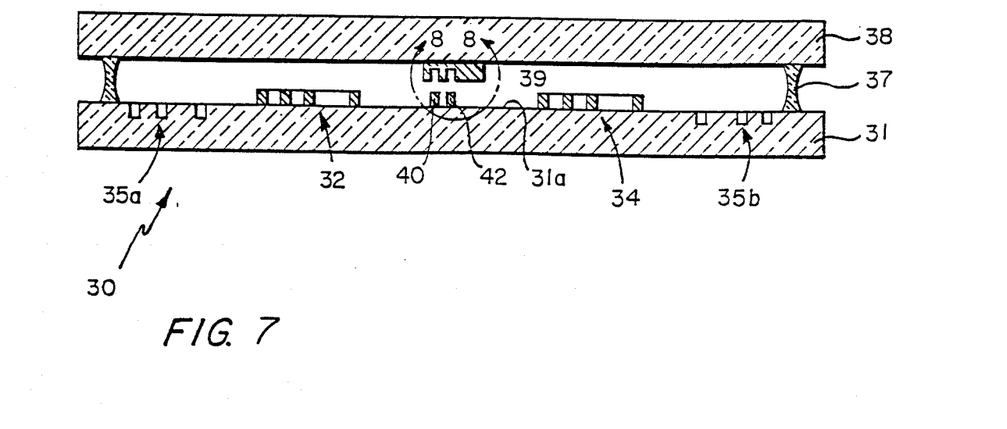
FIG. 7 is a cross-sectional view taken along lines 7—7 of FIG. 6.
Figure 8:
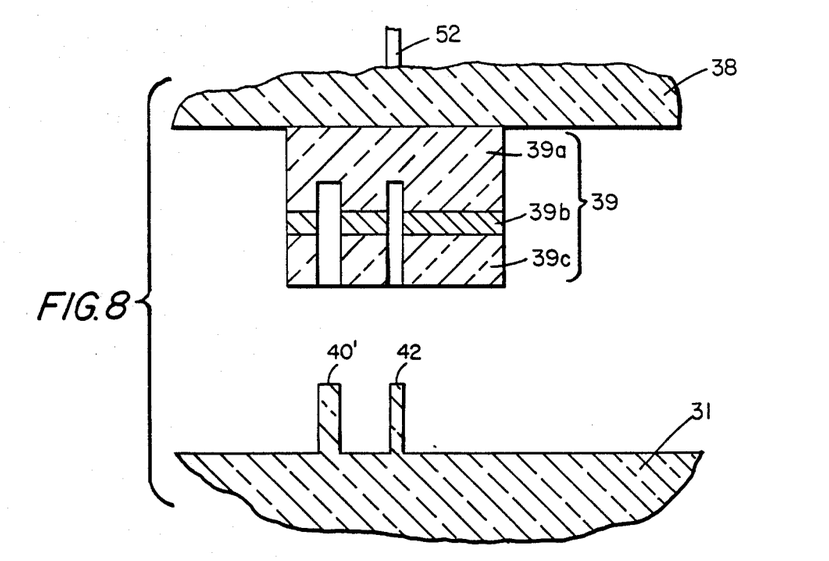
FIG. 8 is an exploded, enlarged view of FIG. 7 taken along line 8—8 of FIG. 7.

As shown in FIGS. 6–8, after deposits of material 40', 40'' used to tune the frequency of the third order transverse mode to correspond to that of the fundamental mode, the fundamental mode frequency may be selectively altered to provide a selected shift in the frequency characteristic thereof. As shown in FIGS. 6–8, a single line of material 42 is shown deposited across the entire acoustic aperture of the surface wave device on surface wave propagation surface 41. Layer 42 provides a localized region of change of surface wave velocity characteristic across the entire acoustic aperture to tune the frequency fundamental transverse mode and thus selectively change the center frequency of the device.

A full explanation of the deposition technique, as well as, examples of other deposition to provide layer 42 and layers 40' and 40'' is described in my copending application Ser. No. 153,186 filed Feb. 8, 1988 and assigned to the assignee of the present invention and incorporated herein by reference.

Having described preferred embodiments in the invention, it will now become apparent to one skill in the art that other embodiments incorporating their concepts may be used. It is felt, therefore, that these embodiments should not be limited to disclosed embodiments, but rather should be limited only by the spirit and scope of the appended claims.

What is claimed is:
1. A surface acoustic wave device comprising:
   a base having a surface for supporting surface wave propagation including at least a transducer coupled to said surface wave propagation surface; and
   means disposed on said surface wave propagation surface wherein an odd order transverse mode has maximal energy for locally changing the surface wave velocity characteristic to adjust the frequency of said odd order transverse mode to be substantially equal to that of a fundamental propagation mode.

2. The device of claim 1 wherein said means for locally changing surface wave velocity comprises a pair of spaced regions of material disposed on said surface.

3. The device of claim 2 wherein said pair of regions of material are disposed over a relatively minor portion of an acoustic aperture of said transducer.

4. The device of claim 3 wherein said odd mode transversal wave is a third order transverse wave, and the frequency thereof is reduced to be substantially equal to that of the fundamental mode.

5. The device of claim 3 wherein said regions of material are displaced away from central portions of an acoustic aperture of said transducer, towards peripherial portions of said acoustic aperture.

6. A method of adjusting the third order transverse mode frequency of a SAW resonator comprises the step of:

depositing a pair of layers of material on a corresponding pair of regions of the SAW resonator surface where said third order transverse mode has energy maxima to lower the frequency of said mode to be substantially equal to that of a fundamental propagation mode of said resonator.

7. The method of claim 6 wherein said SAW resonator includes a base which supports surface wave propagation having disposed thereon said pair of layers of material; and a cover having disposed thereon a pad of material from which the pair of layers were deposited.

8. The method of claim 7 wherein the depositing step further includes the step of:

directing a laser beam through the cover of said SAW resonator towards the pad to ablate from the pad selected portions thereof to form the pair of layers of material on said surface.

9. The method of claim 8 wherein the pad is comprised of three layers including a first dielectric layer disposed on the cover, a metal layer disposed on the dielectric layer, and a second dielectric disposed on the metal layer.

10. A surface acoustic wave resonator comprising:

a base having a surface which supports surface wave propagation including a pair of transducers coupled to said surface wave propagation surface;

a cover disposed over said base, enclosing said surface propagating surface, said cover comprised of a material which is optically transparent to electromagnetic energy generally in the wavelength range of about 0.185 $\mu$m to 4 $\mu$m;

a layer of material disposed on an inner portion of said cover and over said surface wave propagation surface in a region thereof disposed between said pair of transducers; and first and second selected portions of the material of said layer disposed on said surface wave propagating surface in a region of said surface wave propagating surface where an undesired odd order transverse mode has a maximal energy to change the frequency of said odd order transverse mode.

11. The resonator of claim 10 wherein said undesired odd order transverse mode is a third order mode and the frequency thereof is reduced to be substantially equal to that of a fundamental mode.

12. The resonator of claim 11 further comprising layer disposed on and across said surface to adjust the frequency characteristics thereof, including the third order mode and fundamental mode of said device.

13. The resonator of claim 11 further comprising a third portion of the material of the layer disposed on and across said surface to adjust the frequency characteristics of said resonator, including the third order and fundamental modes.

* * * * *